United States Patent
Murata et al.

(10) Patent No.: US 10,962,565 B2
(45) Date of Patent: Mar. 30, 2021

(54) SUBSTRATE INSPECTION APPARATUS

(71) Applicant: TOKYO ELECTRON LIMITED, Tokyo (JP)

(72) Inventors: Michio Murata, Nirasaki (JP); Tatsuo Kawashima, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 44 days.

(21) Appl. No.: 16/087,851

(22) PCT Filed: Feb. 7, 2017

(86) PCT No.: PCT/JP2017/005031
§ 371 (c)(1),
(2) Date: Sep. 24, 2018

(87) PCT Pub. No.: WO2017/169179
PCT Pub. Date: Oct. 5, 2017

(65) Prior Publication Data
US 2019/0107557 A1    Apr. 11, 2019

(30) Foreign Application Priority Data

Mar. 28, 2016 (JP) .............................. JP2016-063373

(51) Int. Cl.
| | |
|---|---|
| *G01R 1/04* | (2006.01) |
| *G01R 1/067* | (2006.01) |
| *G01R 31/28* | (2006.01) |
| *G01R 1/073* | (2006.01) |

(52) U.S. Cl.
CPC ....... *G01R 1/06766* (2013.01); *G01R 1/0433* (2013.01); *G01R 1/07314* (2013.01); *G01R 31/28* (2013.01)

(58) Field of Classification Search
CPC .............. G01R 1/0433; G01R 1/06766; G01R 1/07314; G01R 31/2889; G01R 31/2896; G01R 31/2846; G01R 35/00
USPC ........................................ 324/754.07, 754.06
See application file for complete search history.

(56) References Cited

U.S. PATENT DOCUMENTS

| | | | | |
|---|---|---|---|---|
| 2006/0273809 A1* | 12/2006 | Miller | .............. | G01R 31/31905 324/750.05 |
| 2015/0077152 A1* | 3/2015 | Murata | .............. | G01R 31/2889 324/756.03 |

FOREIGN PATENT DOCUMENTS

| | | |
|---|---|---|
| JP | 07297242 A | 11/1995 |
| JP | 2000-121704 A | 4/2000 |
| JP | 2015-084398 A | 4/2015 |

\* cited by examiner

*Primary Examiner* — Melissa J Koval
*Assistant Examiner* — Courtney G McDonnough
(74) *Attorney, Agent, or Firm* — Nath, Goldberg & Meyer; Jerald L. Meyer

(57) ABSTRACT

There is provided a substrate inspection apparatus capable of inspecting the electrical characteristics of a packaged semiconductor device in a mounting environment. A prober includes a test box, a probe card and a package inspection card. A packaged device is attached to the package inspection card. A test board of the test box and a card board of the package inspection card reproduce the mounting environment in which a wafer-level system-level test is performed.

2 Claims, 5 Drawing Sheets

10

SUBSTRATE INSPECTION APPARATUS

TECHNICAL FIELD

The present disclosure relates to a substrate inspection apparatus that inspects a semiconductor device formed on a substrate without detaching the semiconductor device from the substrate.

BACKGROUND

A prober is known as a substrate inspection apparatus for inspecting electrical characteristics of semiconductor devices, such as power devices and memories, formed on a semiconductor wafer (hereinafter simply referred to as a "wafer") as a substrate.

The prober includes a probe card having a number of pin-like probes, a stage which freely moves a wafer placed on the stage vertically and horizontally, and an IC tester. Each probe of the probe card is brought into contact with an electrode pad or a solder bump formed on the semiconductor device, and a signal obtained from the semiconductor device is transmitted to the IC tester to inspect the electrical characteristics of the semiconductor device (see, e.g., Patent Document 1).

The IC tester determines the acceptability of the electrical characteristics and functions of the semiconductor device based on the transmitted signal. The IC tester has a circuit configuration different from a circuit configuration in which a packaged semiconductor device (hereinafter referred to as a "packaged device") is mounted, for example, the circuit configuration of a motherboard or a function expansion card. Because of this, the IC tester fails to determine the acceptability of the electrical characteristics in the mounted state. As a result, there is a problem that defects of the semiconductor device which have not been detected by the IC tester are found when the packaged device is mounted on the motherboard or the like. Particularly, in recent years, with the complication and speeding up of semiconductor devices, a test pattern in the IC tester becomes larger in size, and a fine control of the test timing is required. This makes the above-mentioned problem conspicuous.

Therefore, in order to guarantee the quality of a semiconductor device, there has been proposed a technique for installing, in place of the IC tester, an inspection circuit for reproducing a circuit configuration in which a packaged device is mounted on a probe card, for example, a circuit configuration of a motherboard, and using the probe card to measure the electrical characteristics of the semiconductor device without detaching the semiconductor device from a wafer in an environment in which the packaged device is mounted on the mother board (hereinafter referred to as a "mounting environment") is reproduced (see, e.g., Patent Document 2). The semiconductor device inspection performed in such a mounting environment is referred to as a wafer-level system-level test.

Meanwhile, after packaging and shipping semiconductor devices that passed the wafer-level system-level test, the packaged devices may malfunction on the market. In this case, in order to pursue a cause of the malfunction, it is necessary to inspect the electrical characteristics of the packaged devices in a mounting environment where the wafer-level system-level test is performed.

[Prior Art Documents]

Patent Documents

Patent Document 1: Japanese laid-open publication No. Hei 7-297242

Patent Document 2: Japanese laid-open publication No. 2015-84398

The probe card of the prober which performs the wafer-level system-level test is brought into electrical contact with the electrode pad or the solder bump of the semiconductor device by using each probe. However, the packaged device does not include an electrode pad and a solder bump. Therefore, there is a problem that the use of the probe card fails to inspect the electrical characteristics of the packaged device in the mounting environment.

SUMMARY

The present disclosure provides some embodiments of a substrate inspection apparatus capable of inspecting electrical characteristics of a packaged semiconductor device in a mounting environment.

According to one embodiment of the present disclosure, there is provided a substrate inspection apparatus including: a probe card having a plurality of probes configured to make contact with each electrode of a semiconductor device formed on a substrate; a test box electrically connected to the probe card, wherein the test box includes an inspection board on which a circuit is formed, and the probe card and the inspection board are configured to reproduce a mounting environment of the semiconductor device which is cut out from the substrate and is packaged; and a package inspection card to which the packaged semiconductor device is attached, wherein the test box is electrically connected to the package inspection card, wherein the package inspection card includes another inspection board on which a circuit is formed, and wherein the inspection board and the another inspection board reproduce the mounting environment.

According to the present disclosure, an inspection board of a test box and another inspection board of a package inspection card to which a packaged semiconductor device is attached reproduce a mounting environment of the packaged semiconductor device detached from a substrate, namely a mounting environment in which a wafer-level system-level test is performed. Therefore, by attaching the packaged semiconductor device to the package inspection card, it is possible to inspect the electrical characteristics of the packaged semiconductor device in the mounting environment in which the wafer-level system-level test is performed.

DETAILED DESCRIPTION

Embodiments of the present disclosure will now be described in detail with reference to the accompanying drawings.

Figure 1:
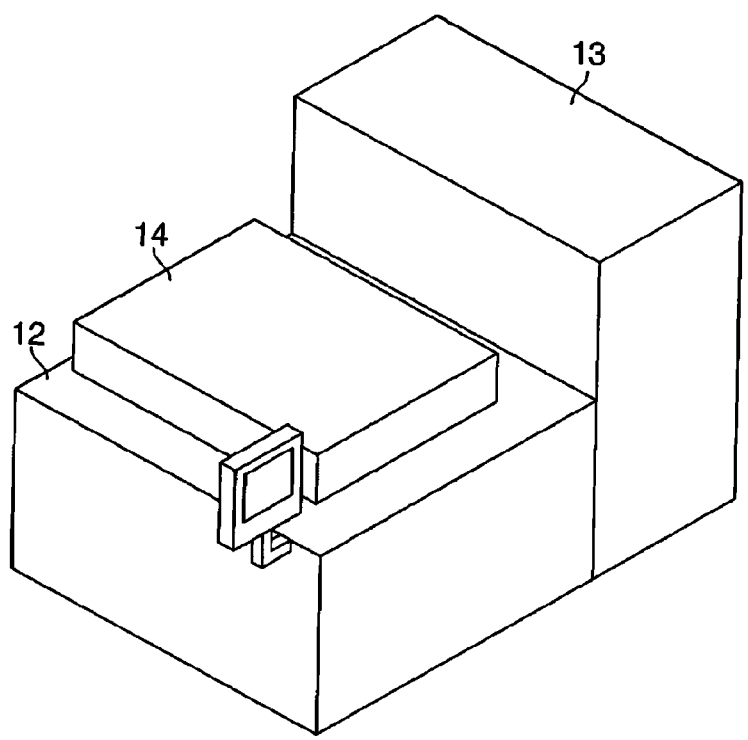
FIG. 1 is a perspective view schematically illustrating the configuration of a prober as a substrate inspection apparatus according to an embodiment of the present disclosure.
Figure 2:
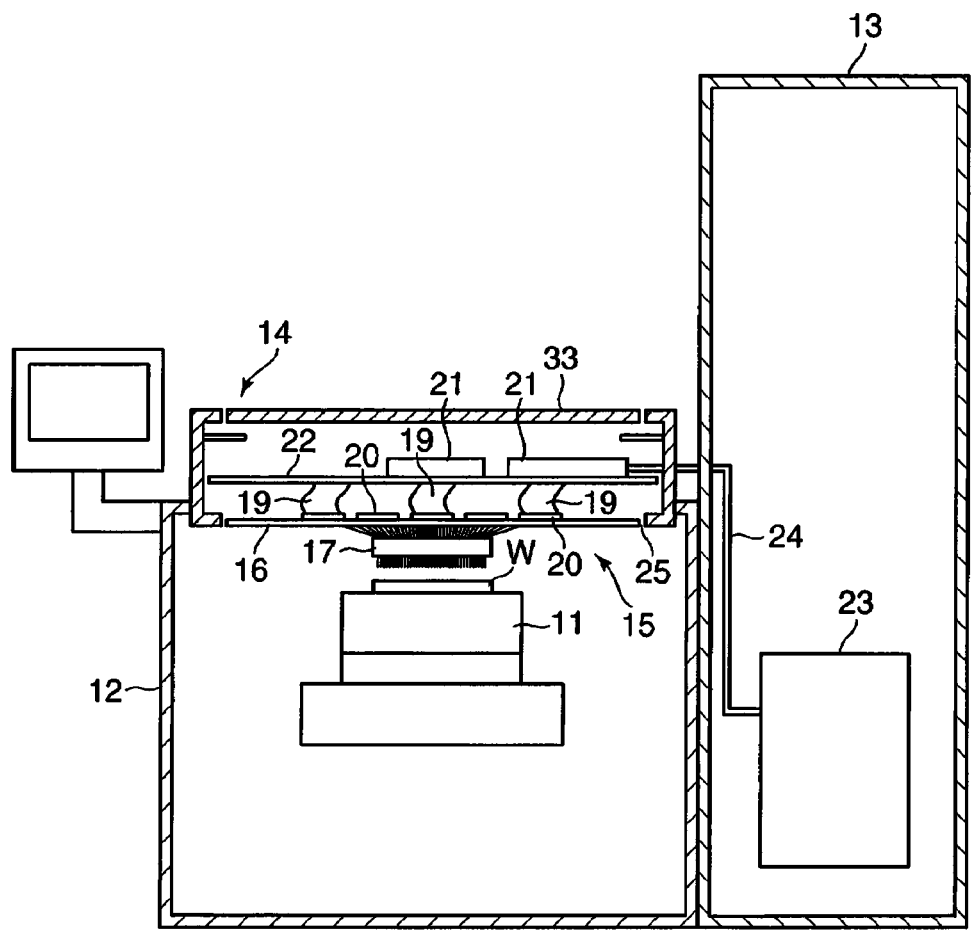
FIG. 2 is a front view schematically illustrating the configuration of a prober as a substrate inspection apparatus according to an embodiment of the present disclosure.

FIG. 1 is a perspective view schematically illustrating the configuration of a prober as a substrate inspection apparatus according to an embodiment, and FIG. 2 is a front view thereof. FIG. 2 is drawn as a partial cross-sectional view, showing a main body 12, a loader 13 and components included in a test box 14, which will be described later.

Figure 3:
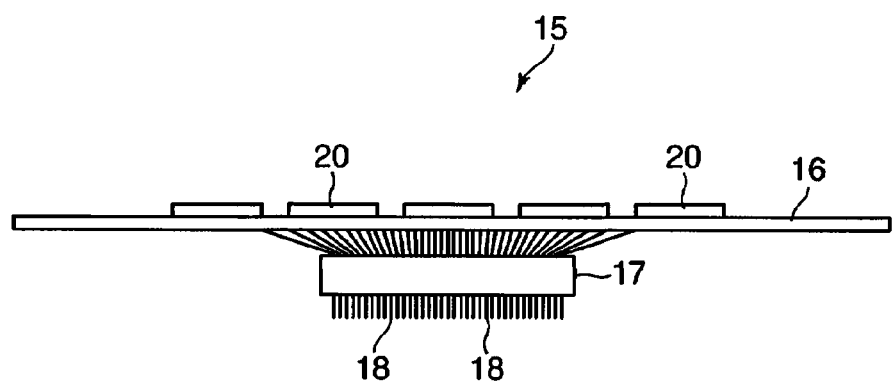
FIG. 3 is a front view schematically illustrating the configuration of a probe card of the prober in FIG. 1.

In FIGS. 1 and 2, a prober 10 includes the main body 12 incorporating a stage 11 on which a wafer W is placed, the loader 13 disposed adjacent to the main body 12, and the test box 14 disposed so as to cover the main body 12, and inspects electrical characteristics of a semiconductor device which is a DUT (Device Under Test) formed on the wafer W. The main body 12 has a hollowed housing shape. In the interior of the main body 12, the stage 11 and a probe card 15 arranged to face the stage 11 are disposed. The probe card 15 is disposed to face the wafer W. The probe card 15 includes a plate-shaped card board 16 and a probe head 17 disposed below the card board 16 to face the wafer W. As illustrated in FIG. 3, the probe head 17 includes a number of needle-like probes 18 which correspond to electrode pads and solder bumps of a semiconductor device of the wafer W.

The wafer W is fixed to the stage 11 so as not to shift relative to the stage 11. The stage 11 is movable in the horizontal direction and the vertical direction. The relative position of the probe card 15 and the wafer W is adjusted to bring the electrode pads and the solder bumps of the semiconductor device into contact with the respective probes 18 of the probe head 17. The loader 13 takes the wafer W, on which the semiconductor device is formed, out of a FOUP (not shown) which is a transfer container, places the wafer W on the stage 11 inside the main body 12, removes the wafer W subjected to the wafer-level system-level test from the stage 11 and accommodates the wafer W into the FOUP.

A card-side inspection circuit 20 for reproducing a portion of a circuit configuration in which a packaged semiconductor device (packaged device) cut out from the wafer W is mounted, for example, a circuit configuration of the mother board, is formed on the card board 16 of the probe card 15 (see FIG. 3). The card-side inspection circuit 20 is connected to the probe head 17. When the respective probes 18 of the probe head 17 come into contact with the electrode pads or the solder bumps of the semiconductor device of the wafer W, the respective probes 18 supply electric power to the power supply of the semiconductor device or deliver a signal from the semiconductor device to the card-side inspection circuit 20.

The test box 14 includes a harness 19 which is a wiring, a test control unit and a recording unit (both not shown), and a test board 22 (inspection board) on which a box-side inspection circuit 21 for reproducing a portion of the circuit configuration of the mother board is formed. The harness 19 connects the test board 22 of the test box 14 and the card board 16 of the probe card 15, and delivers a signal from the card-side inspection circuit 20 to the box-side inspection circuit 21. In the prober 10, by replacing the test board 22 of the test box 14, a portion of the circuit configuration of plural types of mother boards may be reproduced.

The loader 13 incorporates a base unit 23 including a power supply, a controller and a simple measurement module. The base unit 23 is connected to the box-side inspection circuit 21 by a wiring 24. The controller instructs the box-side inspection circuit 21 to start inspection of the electric characteristics of the semiconductor device. In the prober 10, as described above, each of the card-side inspection circuit 20 formed on the card board 16 and the box-side inspection circuit 21 formed on the test board 22 reproduces a portion of the circuit configuration of the mother board. The base unit 23 reproduces a circuit configuration common to various types of mother boards. Therefore, the entire mother board on which the packaged device is mounted is reproduced in cooperation between the card board 16, the test board 22 and the base unit 23. In other words, the card board 16, the test board 22 and the base unit 23 reproduce a mounting environment which is the environment in which the packaged device is mounted on the mother board.

In the prober 10, when the electrical characteristics of the semiconductor device is inspected, for example, the inspection control unit of the box-side inspection circuit 21 transmits data to the card-side inspection circuit 20, and determines whether or not the transmitted data has been correctly processed by the card-side inspection circuit 20 connected to the semiconductor device, based on an electric signal provided from the card-side inspection circuit 20. Further, in the prober 10, the test board 22 of the test box 14 and the card board 16 of the probe card 15 are connected to each other by the harness 19. A bottom opening 25 having a size corresponding to the card board 16 is formed in the bottom of the test box 14, and the test board 22 and the card board 16 face each other. Thus, the test board 22 and the card board 16 can be disposed close to each other, thereby making the harness 19 as short as possible. As a result, in the wafer-level system-level test, it is possible to minimize the influence of the length of the harness 19, for example, the influence of a change in wiring capacitance. This makes it possible to perform the wafer-level system-level test in a mounting environment extremely similar to the operating environment of a computer as the actual machine having a function expansion card and a mother board.

However, after packaging and shipping semiconductor devices that passed the wafer-level system-level test, the packaged device may malfunction on the market. In this case, in order to verify the reliability of the wafer-level system-level test, it is necessary to determine whether the malfunction can be found in the wafer-level system-level test or whether the malfunction is caused by packaging the semiconductor devices after being subjected to the wafer-level system-level test or by an environmental load or an external force in the market. The determination as to whether the malfunction can be found in the wafer-level system-level test is made based on whether the malfunction is reproduced by inspecting the electrical characteristics of the packaged devices that triggered the malfunction in the mounting environment in which the wafer-level system-level test is performed. Specifically, unless the malfunction of the packaged devices in the mounting environment is reproduced, it is determined that the malfunction cannot be found in the wafer-level system-level test. On the other hand, if the malfunction of the packaged devices in the mounting environment is reproduced, it is determined that the malfunction is caused by packaging the semiconductor devices after being subjected to the wafer-level system-level test or by an environmental load or an external force in the market.

In addition, if it is determined that the malfunction cannot be found in the wafer-level system-level test, it is necessary to change the contents of implementation of the wafer-level system-level test. However, when a specific semiconductor device formed on the wafer is used to verify the wafer-level system-level test after the change of the contents of implementation, many other semiconductor devices formed on the wafer may be damaged. Therefore, it is much cheaper to carry out the verification using a packaged device rather than the semiconductor devices formed on the wafer. Further, since the packaged devices can be more easily handled than the wafer, it is easier to carry out the verification using the packaged device. In the case where the probe card 15 and the semiconductor device formed on the wafer are used for verification, each probe 18 comes in contact with the electrode pad or the solder bump of the semiconductor device. However, such contact may cause deterioration of the semiconductor device. Specifically, a needle trace remains on the electrode pad or the solder bump of the semiconductor device. Particularly, when the contact is repeated, the needle trace becomes deeper, which may cause a problem when the packaged device is manufactured from the semiconductor device. Therefore, from the viewpoint of preventing the deterioration of the semiconductor device, it is preferable to carry out the verification using the packaged device rather than the wafer. That is to say, there is a strong need to inspect the electrical characteristics of the packaged device in the mounting environment where the wafer-level system-level test is performed.

On the other hand, the above-described probe card 15 makes electrical contact with the electrode pad and solder bump of the semiconductor device of the wafer W using each probe 18, but the packaged device has no electrode pad and no solder bump. Therefore, the probe card 15 cannot be used to inspect the electrical characteristics of the packaged device in the mounting environment in which the wafer-level system-level test is performed. In the present embodiment, to cope with this problem, the prober 10 further includes a card on which a packaged device can be mounted for inspecting the electrical characteristics of the packaged device (hereinafter referred to as a "package inspection card").

Figure 4:
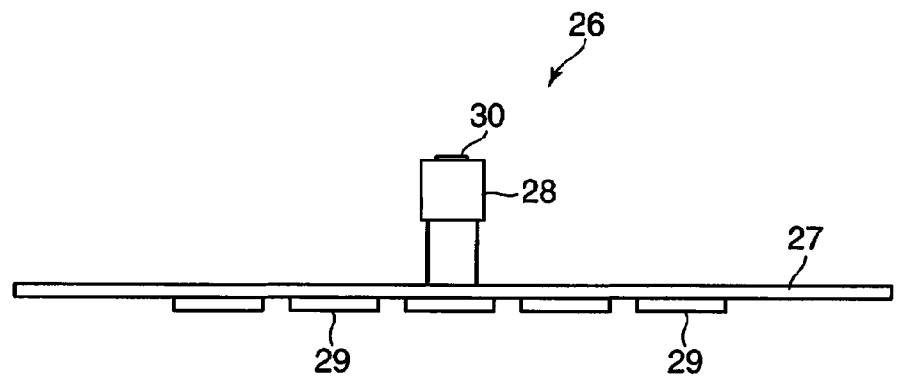
FIG. 4 is a front view schematically illustrating the configuration of a package inspection card of the prober in FIG. 1.

FIG. 4 is a front view schematically illustrating the configuration of a package inspection card included in the prober of FIG. 1.

In FIG. 4, a package inspection card 26 includes a plate-like card board 27 (another inspection board) and a socket 28 disposed on an upper surface of the card board 27 in FIG. 4. A card-side inspection circuit 29 for reproducing a portion of the circuit configuration of a mother board is formed on a lower surface of the card board 27 in FIG. 4. A packaged device 30 is attached to a leading end of the socket 28 and is coupled to the card-side inspection circuit 29 via the socket 28. The socket 28 supplies power to the packaged device 30 or delivers a signal provided from the packaged device 30 to the card-side inspection circuit 29.

Figure 5:
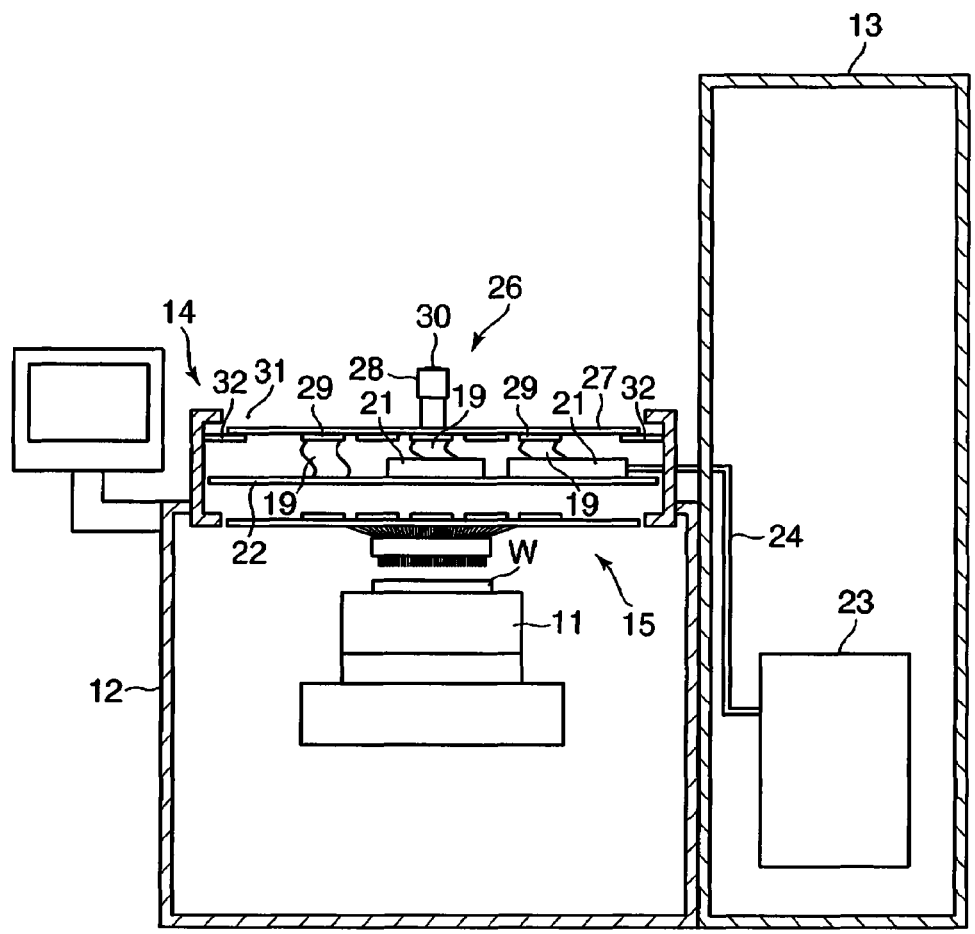
FIG. 5 is a front view for explaining a state in which the package inspection card in FIG. 4 is attached to the prober in FIG. 1.

FIG. 5 is a front view for explaining a state in which the package inspection card 26 in FIG. 4 is attached to the prober in FIG. 1. FIG. 5 is also partially drawn as a sectional view.

In FIG. 5, the test box 14 includes a ceiling port 31 formed in a ceiling surface so as to face the bottom port 25, and a card holder 32 installed in the vicinity of the ceiling port 31 inside the test box 14. The ceiling port 31 has a size corresponding to the card board 27 and is closed by a ceiling plate 33 (see FIG. 2) when performing the wafer-level system-level test.

When inspecting the electrical characteristics of the packaged device 30, the package inspection card 26 is loaded into the test box 14 via the ceiling port 31 and is held by the card holder 32. At this time, the card holder 32 holds the package inspection card 26 so that the socket 28 is oriented towards the side opposite the probe card 15. Further, the card holder 32 holds the package inspection card 26 so that the package inspection card 26 faces the probe card 15 through the test board 22. Here, since one end of the harness 19 is connected to the test board 22, the package inspection card 26 faces the probe card 15 through the harness 19. When the package inspection card 26 is held by the card holder 32, the harness 19 connects the test board 22 of the test box 14 and the card board 27 of the package inspection card 26, and delivers a signal provided from the card-side inspection circuit 29 to the box-side inspection circuit 21. As will be described later, the card holder 32 holds the package inspection card 26 so that the package inspection card 26 is rotatable around one end thereof.

In the package inspection card 26, as described above, the card-side inspection circuit 29 formed on the card board 27 reproduces a portion of the circuit configuration of the mother board, while the box-side inspection circuit 21 formed on the test board 22 reproduces a portion of the circuit configuration of the mother board and the base unit 23 reproduces a circuit configuration common to various types of mother boards. Therefore, the entire motherboard on which the packaged device is mounted is reproduced in cooperation between the card board 27, the test board 22 and the base unit 23. That is to say, the card board 27, the test board 22 and the base unit 23 reproduce the mounting environment in which the wafer-level system-level test is performed.

In the prober 10, when the electrical characteristics of the packaged device 30 are inspected, for example, the inspection control unit of the box-side inspection circuit 21 transmits data to the card-side inspection circuit 29, and determines whether or not the transmitted data has been correctly processed by the card-side inspection circuit 29 connected to the packaged device 30 based on an electric signal provided from the card-side inspection circuit 29.

Figure 6:
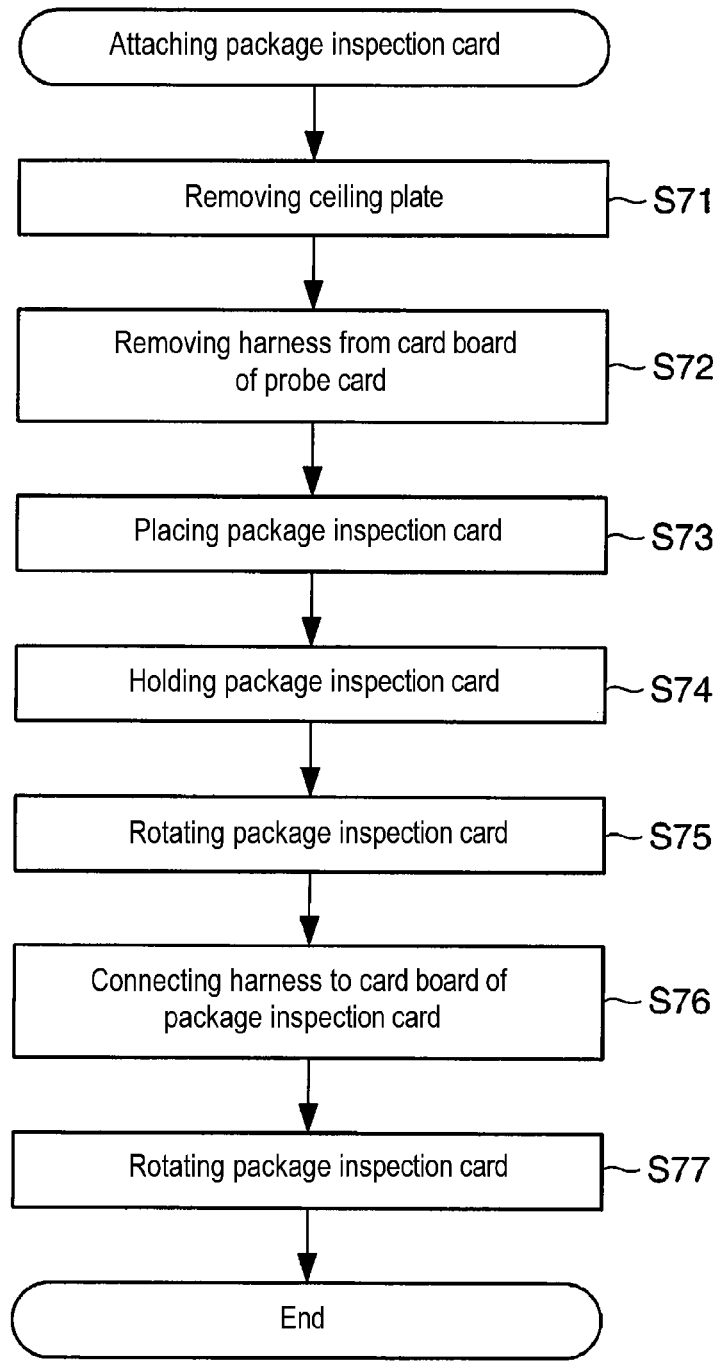
FIG. 6 is a flow chart illustrating a method of attaching a package inspection card to a test box.
Figure 7A:
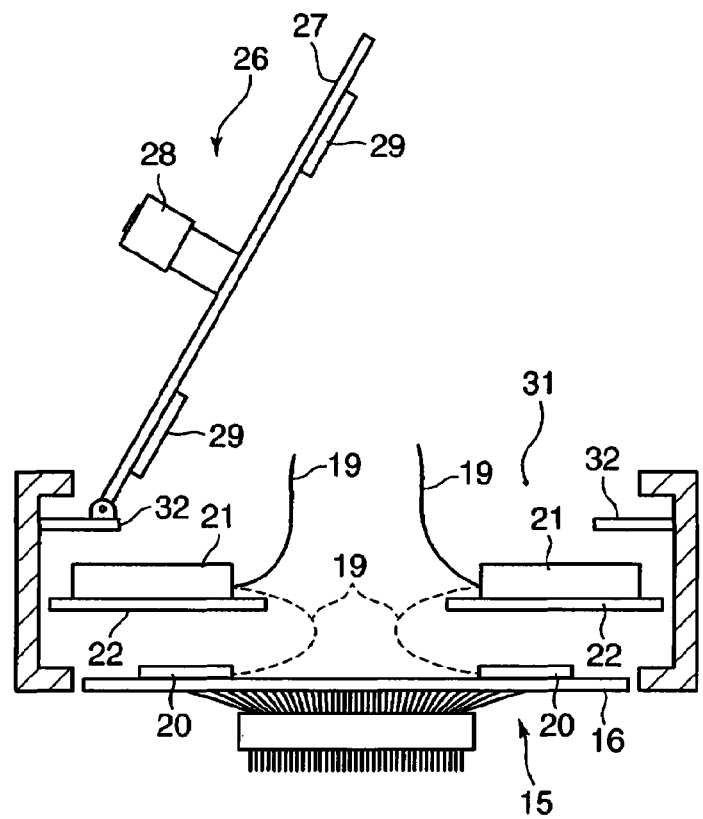
FIGS. 7A and 7B are process diagrams for explaining a connection between a card board of the package inspection card and a test board of the test box with a harness in the attaching method of FIG. 6.
Figure 7B:
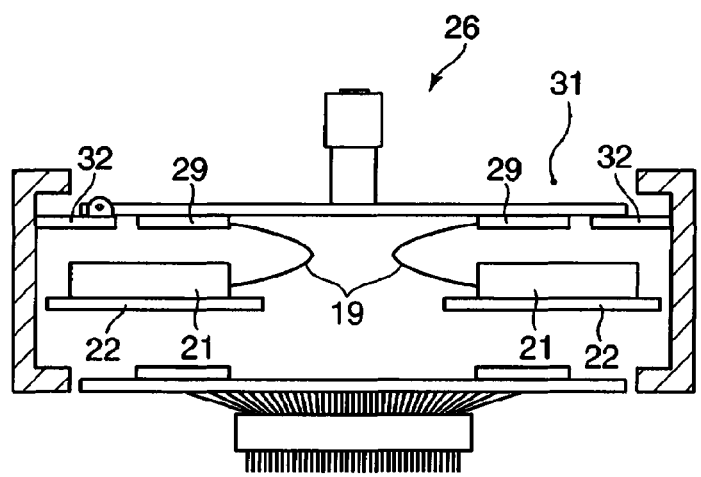

FIG. 6 is a flow chart illustrating a method of attaching a package inspection card to a test box, and FIGS. 7A and 7B are process diagrams for explaining a connection between a card board of the package inspection card and a test board of the test box with the harness in the attaching method of FIG. 6. In FIGS. 7A to 7B, each process is drawn with a sectional view looking at the test box 14 from the right side.

First, the ceiling plate 33 is removed from the test box 14 to open the interior of the test box 14 (step S71). At this time, the harness 19 connecting the test board 22 and the card board 16 of the probe card 15 is exposed.

Thereafter, the other end of the harness 19 is detached from the card board 16 (step S72). Subsequently, the package inspection card 26 is loaded into the test box 14 via the ceiling port 31 and is placed on the card holder 32 (step S73). The package inspection card 26 is held by the card holder 32 (step S74). At this time, the card holder 32 holds the package inspection card 26 so that the package inspection card 26 is rotatable around one end thereof.

Subsequently, as illustrated in FIG. 7A, the package inspection card 26 is rotated around its one end so that the other end of the package inspection card 26 is moved upward in FIG. 7A (step S75). Thus, the interior of the test box 14 is again opened to expose the harness 19. Thereafter, the other end of the harness 19 is connected to the card board 27 of the package inspection card 26 (step S76).

Subsequently, as illustrated in FIG. 7B, the package inspection card 26 is rotated around its one end so that the other end of the package inspection card 26 is moved downward in FIG. 7B (step S77). The interior of the test box 14 is closed and the other end of the package inspection card 26 is held by the card holder 32. In this way, the present method is ended.

As described above, according to the prober 10, the test board 22 of the test box 14 and the card board 27 of the package inspection card 26 reproduce the mounting environment in which the wafer-level system-level test is performed. Therefore, by attaching the packaged device 30 to the package inspection card 26 via the socket 28, it is possible to inspect the electrical characteristics of the packaged device 30 in the mounting environment in which the wafer-level system-level test is performed. As a result, the reliability of the wafer-level system-level test can be easily verified. Further, by using the packaged device rather than a dummy device or the like when verifying the wafer-level system-level test after changing the contents of implementation in the mounting environment in which the wafer-level system-level test is performed, it is possible to improve the reliability of the verification.

In the prober 10 described above, when the packaged device 30 is attached to the package inspection card 26, the test board 22 of the test box 14 is connected to the card board 27 of the package inspection card 26 by the harness 19 used for connection with the card board 16 of the probe card 15. As a result, a difference between the mounting environment reproduced by the card board 16 of the probe card 15 and the test board 22 and the mounting environment reproduced by the card board 27 of the package inspection card 26 and the test board 22 corresponds to a difference in configuration between the card board 16 and the test board 22. It is therefore possible to make the two mounting environments almost the same.

Further, in the prober 10 described above, since the package inspection card 26 faces the probe card 15 through the harness 19, the harness 19 easily reaches both the card board 16 of the probe card 15 and the card board 27 of the package inspection card 26. That is to say, it is possible to easily connect the same harness 19 to both the card board 16 and the card board 27.

Furthermore, in the prober 10 described above, the card holder 32 holds the package inspection card 26 so that the package inspection card 26 is rotatable around its one end. Thus, by rotating the package inspection card 26, the interior of the test box 14 is opened to easily expose the harness 19. This makes it possible to improve the workability of attachment/detachment of the harness 19 to/from the card board 16 of the probe card 15 and the workability of attachment/detachment of the harness 19 to/from the card board 27 of the package inspection card 26.

In the prober 10 described above, since the card holder 32 holds the package inspection card 26 so that the socket 28 is oriented towards the opposite side of the probe card 15, the package inspection card 26 can be attached to the test box 14 without interference of the socket 28 with the probe card 15 and the test board 22. In addition, as the socket 28 is oriented towards the opposite side of the probe card 15, the packaged device 30 attached to the leading end of the socket 28 is exposed from the test box 14. This facilitates handling of the packaged device 30 by an operator, for example, a fine position adjustment performed to improve the contact of the packaged device 30.

Furthermore, in the prober 10 described above, since the card holder 32 is installed inside the test box 14, the package inspection card 26 held by the card holder 32 can be disposed close to the test board 22. This eliminates a need to lengthen the harness 19. As a result, in the inspection of the electrical characteristics of the packaged device 30, it is possible to minimize the influence of the length of the harness 19, for example, the influence of a change in wiring capacitance.

Although the embodiments of the present disclosure have been described above, the present disclosure is not limited to the above embodiments.

This application claims priority based on Japanese Patent Application No. 2016-063373 filed on Mar. 28, 2016, the entire contents of which are incorporated herein by reference.

EXPLANATION OF REFERENCE NUMERALS

W: wafer, 10: prober, 14: test box, 15: probe card, 19: harness, 21: box-side inspection circuit, 22: test board, 26: package inspection card, 27: card board, 28: socket, 29: card-side inspection circuit, 30: packaged device, 32: card holder

What is claimed is:
1. A substrate inspection apparatus comprising:
a probe card having a plurality of probes configured to make contact with each electrode of a semiconductor device formed on a substrate;
a test box electrically connected to the probe card, wherein the test box includes an inspection board on which a circuit is formed, the probe card and the inspection board are configured to reproduce a first mounting environment of the semiconductor device which is cut out from the substrate and is packaged, and the first mounting environment is an environment in which the packaged semiconductor device is mounted on a mother board for a wafer-level system-level test; and
a package inspection card to which the packaged semiconductor device is attached at a position different from a position of the probe card,
wherein the test box is electrically connected to the package inspection card,
wherein the package inspection card includes another inspection board on which a circuit is formed,
wherein the inspection board and the another inspection board reproduce a second mounting environment of the packaged semiconductor device in which the wafer-level system-level test is performed;
wherein the package inspection card is disposed so as to face the probe card with the inspection board interposed between the package inspection card and the probe card;
wherein the test box includes a wiring harness configured to connect the inspection board and the probe card;
wherein, when attaching the packaged semiconductor device to the package inspection card, the inspection board is connected to the another inspection board by the wiring harness;
wherein the test box includes a holder configured to attach the package inspection card to the test box;
the holder rotates the attached package inspection card to expose the wiring harness; and wherein the package inspection card includes a socket to which the packaged semiconductor device is attached, the socket being disposed on the package inspection card so that the socket is oriented towards an opposite side of the probe card.

2. The substrate inspection apparatus of claim 1, wherein the probe card includes a card board which is different from the inspection board and the another inspection board,
wherein a card inspection circuit is formed in the card board.

\* \* \* \* \*